United States Patent
Pietambaram et al.

(10) Patent No.: US 11,348,718 B2
(45) Date of Patent: May 31, 2022

(54) SUBSTRATE EMBEDDED MAGNETIC CORE INDUCTORS AND METHOD OF MAKING

(71) Applicant: Intel Corporation, Santa Clara, CA (US)

(72) Inventors: Srinivas Pietambaram, Gilbert, AZ (US); Kristof Darmawikarta, Chandler, AZ (US); Gang Duan, Chandler, AZ (US); Yonggang Li, Chandler, AZ (US); Sameer Paital, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 694 days.

(21) Appl. No.: 16/022,894

(22) Filed: Jun. 29, 2018

(65) Prior Publication Data
US 2020/0005987 A1    Jan. 2, 2020

(51) Int. Cl.
*H01F 27/26*    (2006.01)
*H01F 27/42*    (2006.01)
(Continued)

(52) U.S. Cl.
CPC ........... *H01F 27/26* (2013.01); *H01F 27/425* (2013.01); *H01L 21/76871* (2013.01);
(Continued)

(58) Field of Classification Search
CPC .. H01F 17/0006; H01F 17/0013; H01F 5/003; H01F 27/245; H01F 27/26;
(Continued)

(56) References Cited

U.S. PATENT DOCUMENTS 6,175,293 B1 *  1/2001  Hasegawa ........... H01F 1/15308
                                                        336/150
7,750,413 B2 *  7/2010  Hayashi .............. H01L 23/5227
                                                        257/374
(Continued)

FOREIGN PATENT DOCUMENTS

DE    112019003318 T5    3/2021
JP        06120048 A  *  4/1994  ......... H01F 17/0006

OTHER PUBLICATIONS

"International Application Serial No. PCT US2019 034250, International Search Report dated Sep. 20, 2019", 3 pgs.
(Continued)

*Primary Examiner* — Tszfung J Chan
(74) *Attorney, Agent, or Firm* — Schwegman Lundberg & Woessner, P.A.

(57) ABSTRACT

Described are microelectronic devices including an embedded microelectronic package for use as an integrated voltage regulator with a microelectronic system. The microelectronic package can include a substrate and a magnetic foil. The substrate can define at least one layer having one or more of electrically conductive elements separated by a dielectric material. The magnetic foil can have ferromagnetic alloy ribbons and can be embedded within the substrate adjacent to the one or more of electrically conductive elements. The magnetic foil can be positioned to interface with and be spaced from the one or more of electrically conductive element.

15 Claims, 11 Drawing Sheets

(51) Int. Cl.
  *H01L 21/768* (2006.01)
  *H01L 23/64* (2006.01)
  *H01F 27/25* (2006.01)
  *H01F 27/245* (2006.01)

(52) U.S. Cl.
  CPC .......... *H01L 23/645* (2013.01); *H01F 27/245* (2013.01); *H01F 27/25* (2013.01)

(58) Field of Classification Search
  CPC ........... H01F 27/2804; H01F 2017/066; H01F 2027/2809; H01L 23/5227; H01L 23/5383; H01L 23/645; H01L 23/49838; H01L 25/0657; H01L 28/10; H01L 2225/06513; H01L 2225/06572
  USPC .................................. 336/200, 232; 257/531
  See application file for complete search history.

(56) References Cited

U.S. PATENT DOCUMENTS

| | | | |
|---|---|---|---|
| 9,966,186 B1* | 5/2018 | Peng | H01F 10/132 |
| 2004/0021218 A1* | 2/2004 | Hayama | G06K 19/07783 |
| | | | 257/700 |
| 2008/0157910 A1* | 7/2008 | Park | H01L 23/5227 |
| | | | 336/110 |
| 2009/0212391 A1* | 8/2009 | Carobolante | H01L 28/10 |
| | | | 257/531 |
| 2013/0056847 A1 | 3/2013 | Chen | |
| 2015/0102892 A1* | 4/2015 | Yeo | H02J 50/70 |
| | | | 336/200 |
| 2015/0302974 A1 | 10/2015 | Zhao et al. | |
| 2016/0155692 A1 | 6/2016 | Dosluoglu | |
| 2016/0163443 A1 | 6/2016 | Erturk et al. | |
| 2016/0233153 A1 | 8/2016 | Kidwell, Jr. et al. | |

OTHER PUBLICATIONS

"International Application Serial No. PCT US2019 034250, Written Opinion dated Sep. 20, 2019", 8 pgs.

Dong, Hai, et al., "Magnetic Nanocomposite for High Q Embedded Inductor", 9th Int'l Symposium on Advanced Packaging Mater, (2004), 4 pgs.

Sun, Teng, et al., "Substrate embedded th in-film Inductors with magnetic cores for ntegrated Voltage Regulators", Transactionson Magnetics, (2017), 17 pgs.

Yazaki, Yuichiro et al., "Embedded PlanarPower Inductorin an Organic Interposer for Package-Level DC PowerGrid", IEEE Transactions on Magnetics, vol. 50, No. 11, (Nov. 2014), 4 pgs.

"International Application Serial No. PCT/US2019/034250, International Preliminary Report on Patentability dated Jan. 7, 2021", 10 pgs.

* cited by examiner

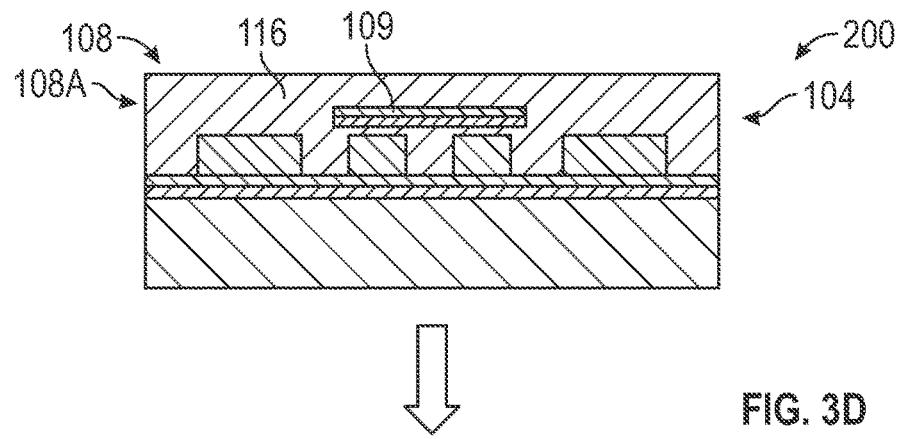
FIG. 3D
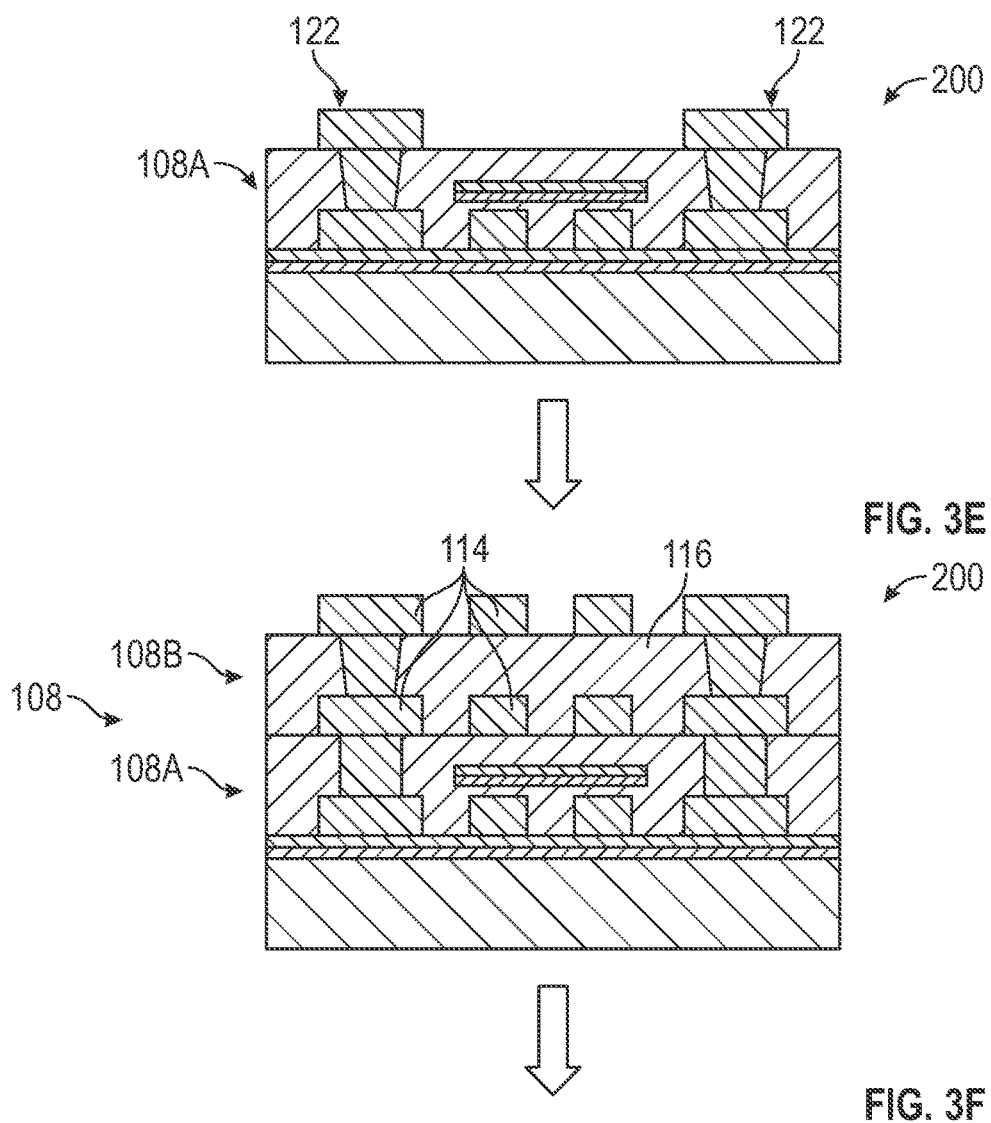
FIG. 3E
FIG. 3F

SUBSTRATE EMBEDDED MAGNETIC CORE INDUCTORS AND METHOD OF MAKING

TECHNICAL FIELD

Embodiments described herein relate generally to microelectronic devices having one or more substrate embedded components, and more particularly, to electronic packages including embedded magnetic core inductors formed of magnetic foils.

BACKGROUND

Microelectronic devices are packaged in multiple ways. Many forms of microelectronic devices, such as IC (integrated circuit) packages, include a substrate supporting one or more electronic components sometimes including one or more electronic components embedded within the substrate (i.e., retained at least partially beneath a surface of the substrate) to form at least a portion of the microelectronic device. In many examples, electronic systems may have one or more semiconductor dies coupled above the surface of microelectronic devices have embedded electronic components within the substrate.

In some cases, the one or more embedded components can be configured to act as inductors to control power supply to individual electronic devices. The embedding of inductors provides many advantages. However, conventional processes used to manufacture such embedded inductors may result in some undesired drawbacks. For example, some approaches require a thicker substrate core (~100 μm) as a starting material or require a large foot print to reduce eddy current loss and minimize hysteresis. These approaches not only impair Z height limit, but can also add extra process steps in some cases. These approaches also suffer in that they add non-insignificant cost and complexity to the fabrication. Other approaches to embedding inductors in the substrate such as paste printing manufacturing can suffer from constraints associated with printing accuracy.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIGS. 3A-3H depict in cross-sectional schematic representations various stages in an example process for forming the electronic package of FIGS. 1 and 2 with the embedded magnetic core inductor.

DESCRIPTION OF EMBODIMENTS

Reference will now be made in detail to certain embodiments of the disclosed subject matter, examples of which are illustrated in part in the accompanying drawings. Other embodiments may incorporate structural, logical, electrical, process, and other changes. Portions and features of some embodiments may be included in, or substituted for, those of other embodiments. While the disclosed subject matter will be described in conjunction with the enumerated claims, it will be understood that the exemplified subject matter is not intended to limit the claims to the disclosed subject matter.

The product space in the areas of Internet of Things (IOTG), Auto Drive and Gaming each require multiple consoles such as RF devices, MEMS, Optics and Sensors beside the CPU processor to provide high end computing experience and communications. Optimum performance of each of these devices requires specific current and voltage. These devices can also perform at higher frequency ranges such as 1-5 GHz. Current air core inductor designs in substrate packages may not be able to meet the above demands due to inherent lower magnetic permeability. While magnetic core inductors may be able to meet these performance criteria, they have Z-height, fabrication and cost challenges as previously discussed in reference to the Background.

The present inventors have recognized that magnetic foils of various shapes and sizes can be embedded in a substrate package using a pick and place based manufacturing technique. The magnetic foils can be embedded in the substrate adjacent the electrically conductive elements (e.g., the traces, contacts, etc.). These electrically conductive elements can be connected through the substrate to or from either (or both) a first major side and/or a second major side of the substrate package. During operation, when electrical current is utilized, the magnetic foils have a magnetic field that improves inductance and Q value while meeting Z-height and other criteria.

Figure 1:
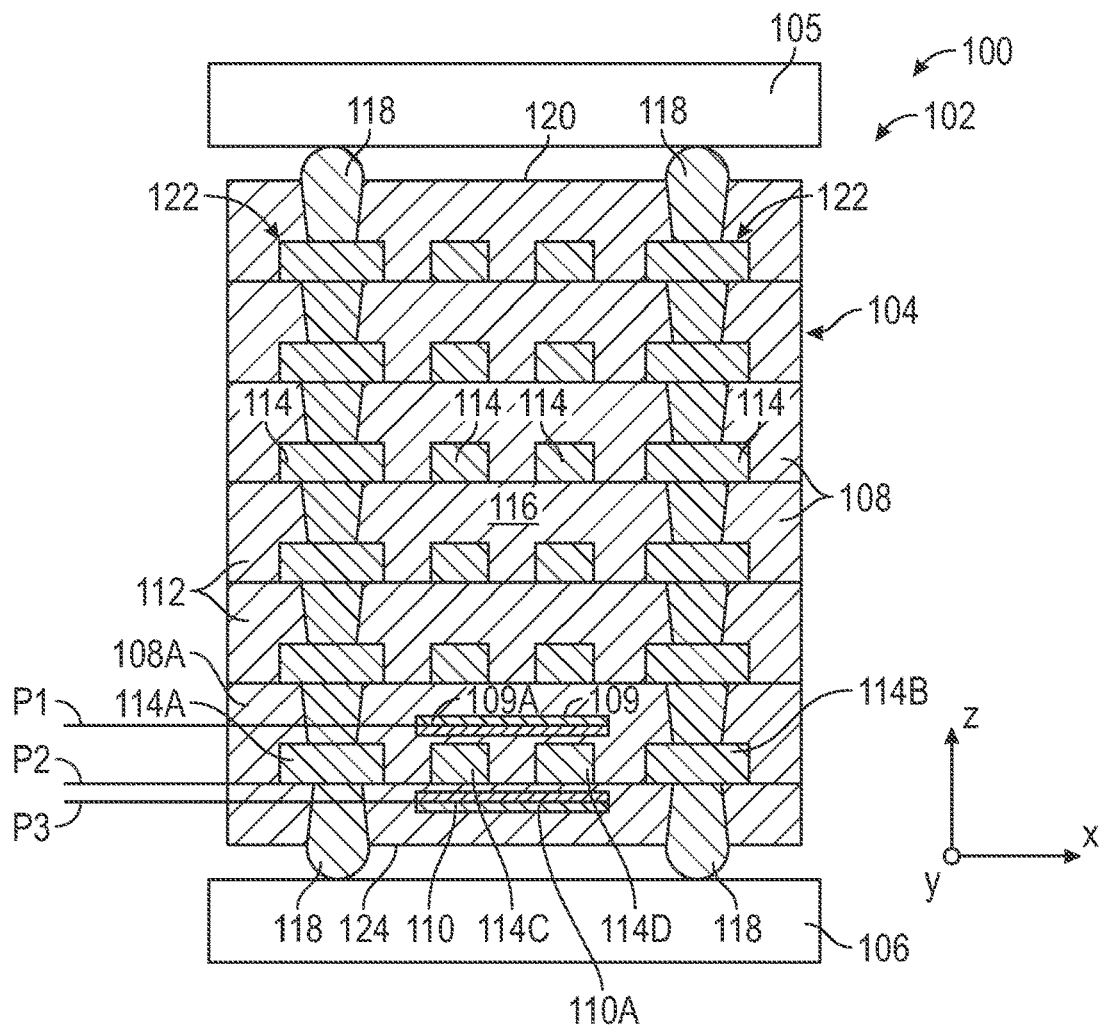
FIG. 1 depicts a cross-section of a schematic representation of an electronic system having an electronic package with an embedded magnetic core inductor formed of magnetic foils according to one example of the present application.

FIG. 1 schematically illustrates a cross-section side view of an example electronic system 100 that can comprise an integrated circuit (IC) package assembly 102, in accordance with some embodiments. In some embodiments, the electronic system 100 and IC package assembly 102 can include a first microelectronic device 104, a second microelectronic device 105 and a third microelectronic device 106. The first microelectronic device 104 is also referred to herein as a microelectronic package, electronic package or an integrated voltage regulator in this document. The first microelectronic device 104 can include a substrate 108, a first magnetic foil 109 and a second magnetic foil 110. The substrate 108 can have a plurality of layers 112 at least one or more of the plurality of layers 112 having one or more electrically conductive elements 114 and a dielectric material 116.

The IC package assembly 102 is shown in a highly schematic manner and can include a wide variety of suitable configurations in various embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the first microelectronic device 104, the second microelectronic device 105, the third microelectronic device 106 and other components of the IC package assembly 102 are contemplated and can be used in other embodiments. The first microelectronic device 104, the second microelectronic device 105 and the third microelectronic device 106 are shown in a highly schematic manner in FIG. 1. According to one embodiment, the second microelectronic device 105 and/or third microelectronic device 106 can comprise a semiconductor chip that is configured to couple to another electronic component such as a board.

In some embodiments, the first microelectronic device 104 may represent a discrete product that can be used with silicon dies. The first microelectronic device can be constructed using semiconductor fabrication techniques such as thin film deposition, lithography, etching, and the like used in connection with forming complementary devices such as metal-oxide-semiconductor (CMOS) devices. In some embodiments, the first microelectronic device 104 may be, include, or be a part of a processor, memory, SoC, or ASIC.

In some embodiments, the first microelectronic device 104 can be physically and electrically coupled with the second microelectronic device 105 and the third microelectronic device 106, as shown in FIG. 1. This can be accomplished via one or more electrical connections 118 (e.g., one or more microballs, direct contact, bumps, or the like). Other suitable techniques to physically and/or electrically couple the first microelectronic device 104 with the second microelectronic device 105 and/or the third microelectronic device 106 can be used in other embodiments.

The one or more package level electrical connections 118 can electrically and physically couple with the one or more electrically conductive elements 114 to electrically conductive elements (not shown) in the second microelectronic device 105 and/or third microelectronic device 106 to provide a pathway for electrical current as electrical signals to and from the first microelectronic device 104. The electrical signals may include, for example, input/output (I/O) signals and/or power/ground signals that are used in connection with operation of electrical components provided embedded within the first microelectronic device 104, for example. In some embodiments, first microelectronic device 104 is configured with at least some of the one or more electrically conductive elements 114, the first magnetic foil 109, and the second magnetic foil 110 to act as an inductor such that the first microelectronic device 104 can be an integrated voltage regulator to regulate voltage for the system 100 and/or the IC package assembly 102.

As used herein, the term "electrically conductive elements" broadly includes all types of electrical routing features configured to route electrical signals to or from or within the first microelectronic device 104. Thus, the term "electrically conductive elements" includes, for example, traces, pads, pillars and/or a vias. The "electrically conductive elements" includes internal electrical routing features within the first microelectronic device 104 and die-level electrical interconnection and electrical routing features.

Some or all of the one or more electrically conductive elements 114 may be attached to and/or embedded in the substrate 108 in a wide variety of suitable known configurations not specifically illustrated. According to one example, the one or more electrically conductive elements 114 can comprise a die having active circuitry that is attached to a surface of the substrate 108 using die-level interconnect structures that are not specifically shown. The one or more electrically conductive elements 114 are formed of a suitable electrically conductive material, for example, nickel (Ni), palladium (Pd), gold (Au), silver (Ag), copper (Cu), and alloys thereof. According to the embodiment of FIG. 1, the electrically conductive material is Cu. The electrically conductive materials described herein can be a metal, a metal alloy, or a composite containing a metal. The metal may range from about 50 wt % to about 100 wt % of the conductive material, about 95 wt % to about 100 wt % of the conductive material, less than, equal to, or greater than about 50 wt %, 55, 60, 65, 70, 75, 80, 85, 90, 95, or 100 wt % of the conductive material.

The one or more electrical connections 118 can be disposed on a first major surface 120 of the first microelectronic device 104 at some of the electrically conductive elements 114, in particular, at die level electrically conductive pillars 122. The first major surface 120 can be opposed by a second major surface 124 of the first microelectronic device 104. According to some embodiments, the one or more electrical connections 118 are also be disposed adjacent or at the second major surface 124 along a second end of the electrically conductive pillars 122. However, it should be noted that the one or more electrical connections 118 need not be positioned on both the first major surface 120 and the second major surface 124 as shown in the embodiment of FIG. 1 in some embodiments. Furthermore, the electrically conductive pillars 122 need not extend through the entirety of the first microelectronic device 104 in the manner shown in the embodiment of FIG. 1 in some embodiments.

The electrically conductive pillars 122 can extend from at or adjacent the first major surface 120 through apertures in the substrate 108 in a z-direction as indicated by the Cartesian coordinate system toward and to the second major surface 124. The electrically conductive pillars 122 can have a major dimension in the z-direction. The z-direction can also be a build-up direction of the substrate 108 and other components of the first microelectronic device 104 as will be discussed subsequently.

The electrically conductive pillars 122 comprise package-level features configured to route electrical signals between the first microelectronic device 104, the second microelectronic device 105, the third microelectronic device 106, and/or another other microelectronic devices (not shown).

The first magnetic foil 109 and the second magnetic foil 110 can be electrically and/or physically coupled with the substrate 108 and can be embedded therein as shown in the embodiment of FIG. 1. More particularly, taking a first portion 108A such as a layer or several layers of the plurality of layers 112 as an example, the first portion 108A has some of the one or more electrically conductive elements 114 shown as electrically conductive elements 114A, 114B, 114C and 114D and the dielectric material 116 therein. The electrically conductive elements 114A and 114B can be part of the electrically conductive pillars 122.

The dielectric material 116 can separate the one or more electrically conductive elements 114A, 114B, 114C and 114D. The first magnetic foil 109 can be embedded in the substrate 108 within or adjacent first portion 108A. This can position the first magnetic foil 109 adjacent to some of the one or more electrically conductive elements 114 including the electrically conductive elements 114C and 114D. The first magnetic foil 109 can be positioned to interface with and be spaced from the some of the one or more of electrically conductive elements 114C and 114D. In particular, the dielectric material 116 can space the first magnetic foil 109 from the some of the one or more electrically conductive elements 114C and 114D as further discussed below.

As shown in FIG. 1, the first magnetic foil 109 can be positioned within the substrate 108 to have a major surface 109A thereof extend in a first plane P1 that is substantially parallel with a second plane P2 defined by the at least one layer having the one or more of electrically conductive elements 114A, 114B, 114C and 114D. Similarly, the second magnetic foil 110 can be within the substrate 108 to have a major surface 110A thereof extend in a third plane P3 that is substantially parallel with the first plane P1 and/or the second plane P2.

Figure 2:
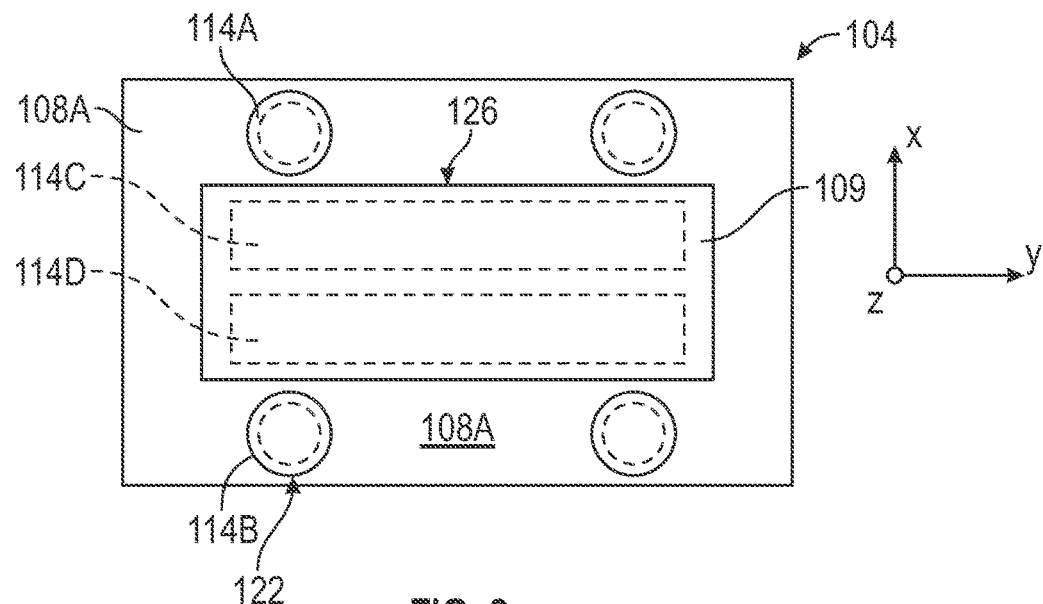
FIG. 2 depicts a second cross-sectional schematic representation of the electronic package taken along lines 2-2 of FIG. 1.

FIG. 2 shows a cross-section of the first portion 108A of the first microelectronic device 104 in a different plane substantially orthogonal from FIG. 1. FIG. 2 shows the first magnetic foil 109 adjacent to some of the one or more electrically conductive elements 114C and 114D. Magnetic foils can have various shapes as desired, for example the foil can be a rectangular, circular or square sheet with alloy ribbons shaped in rectangular, circular or square loop or loops. According to other embodiments the foil can be a rectangular, circular or square sheet with alloy ribbons shaped in rectangular, circular or square spiral loop or loops, the foil and alloy ribbons can have an irregular shape in some cases, etc. Furthermore, the conductive elements 114C and 114D can be shaped in any manner desired including an irregular shape. For example, the conductive elements 114C and 114D can have rectangular, circular or square loop or loops, rectangular spiral loop(s), square spiral loop(s), or circular spiral loop(s). For simplicity, FIG. 2 shows the first magnetic foil 109 and the some of the one or more electrically conductive elements 114C and 114D in a highly schematic form. The first magnetic foil 109 and the some of the one or more electrically conductive elements 114C and 114D (and indeed the electrically conductive pillars 122) can have virtually any shape desired in three-dimensions. Contemplated cross-sectional examples of suitable cross-sectional shapes include a circle, an oval, a triangle, a square, a rectangle, a pentagon, a hexagon, a heptagon, and an octagon, for example.

The electrically conductive pillars 122 can be positioned laterally (measured in x-direction as shown in FIG. 1) and/or longitudinally (measured in y-direction as shown in FIG. 2) around the first magnetic foil 109 and the second magnetic foil 110 (FIG. 1). As shown in FIG. 2, a volume 126 can be defined between the electrically conductive pillars 122. The volume 126 comprises a three-dimensional space as illustrated using both FIGS. 1 and 2. In the volume 126 can be positioned the first magnetic foil 109 and the second magnetic foil 110 (FIG. 1) and/or other electronic components (e.g., dies). The electrically conductive pillars 122 can electrically connect the some of the one or more electrically conductive elements 114C and 114D (via traces or other electrically conductive elements not specifically shown in FIGS. 1 and 2) to the second microelectronic device 105, the third microelectronic device 106 or another electronic component (now shown).

Returning solely now to FIG. 1, the second magnetic foil 110 can be embedded in the substrate 108 adjacent the first portion 108A. This can position the second magnetic foil 110 adjacent to the some of the one or more electrically conductive elements 114C and 114D but on an opposing side of the one or more electrically conductive elements 114C and 114D from the first magnetic foil 109. The second magnetic foil 110 can be positioned to interface with and be spaced from the some of the one or more of electrically conductive elements 114C and 114D. The dielectric material 116 can space the second magnetic foil 110 from the some of the one or more electrically conductive elements 114C and 114D.

As shown in FIG. 1, together the first magnetic foil 109 and the second magnetic foil 110 can be shaped in two dimensions to enclose the some of the one or more of electrically conductive elements 114C and 114D in one or more dimensions (here the x-direction and the y-direction).

The thickness of the dielectric material 116 between the first magnetic foil 109 and the some of the one or more of electrically conductive elements 114C and 114D and between the second magnetic foil 110 and the some of the one or more of electrically conductive elements 114C and 114D can be between about 1 μm to about 100 μm, inclusive. According to one embodiment, the dielectric material can have a thickness of between about 3 μm and about 10 μm, inclusive.

The substrate 108 can be an epoxy-based laminate substrate, for example, an Ajinomoto Build-up Film (ABF). The dielectric material 116 can be a dielectric film material that is an epoxy based resin with a balance material (e.g. epoxy or silica) ranging from about 20 wt % to about 95 wt % of the dielectric, about 90 wt % to about 95 wt % of dielectric layer 210, less than equal to, or greater than about 50 wt %, 55, 60, 65, 70, 75, 80, 85, 90, or 95 wt % of the dielectric. The substrate 108 can include other suitable types of substrates in other embodiments including, for example, substrates formed from glass, ceramic, or other semiconductor materials known to persons skilled in the art.

As described above, in some embodiments the substrate 108 can include further electrically conductive elements 114 that are at least partially embedded within the dielectric material 116. This structure is not shown specifically in FIG. 1, but could be part of the first microelectronic component 104, for example.

The first magnetic foil 109 and the second magnetic foil 110 are illustrated in FIG. 1 as being disposed adjacent the second major surface 124 relatively closer the second major surface 124 than the first major surface 120. It should be recognized that the positioning of the first magnetic foil 109 and/or the second magnetic foil 110 within the substrate 108 can be altered as desired. Thus, in some cases the first magnetic foil 109 and the second magnetic foil 110 can be disposed adjacent the first major surface 120. Furthermore, it should be noted that although only two magnetic foils are illustrated, further magnetic foils (e.g., a third magnetic foil and a fourth magnetic foil in other portions of the substrate 108) can be utilized as desired.

The first magnetic foil 109 and the second magnetic foil 110 can be formed from commercially available Iron-Cobalt (Fe—Co) and Iron-Nickle (Fe—Ni) based ferromagnetic alloy ribbons. Such as the ferromagnetic alloy ribbons can be a preform component manufactured by Metglas Inc. (www.metglas.com). The ferromagnetic alloy ribbons can be shaped as desired to form the preform foil. The alloy ribbons when formed as the magnetic foil can have a narrow hysteresis loop with little coercive magnetic field. This can be desirable for inductor applications as little or no hysteresis loss is desired in such applications. The first magnetic foil 109 and the second magnetic foil 110 can be between about 10 μm and 100 μm thickness in the z-direction of FIG. 1. Despite this relative thinness in the build-up direction, the first magnetic foil 109 and the second magnetic foil 110 can provide a high Q factor. This is because of the high permeability that can be achieved with the alloy ribbons materials. For example, Iron-Cobalt (Fe—Co) and Iron-Nickle (Fe—Ni) can have a permeability as high as >1000 in some cases. However, a permeability of >100 when used as part of a composite with bonding materials such as epoxy, polyimide, etc. is acceptable and contemplated. Q value could additionally be maximized if the width (as measured in the x-direction) of the foils of the first magnetic foil 109 and the second magnetic foil 110 is larger relative to the width (as measured in the x-direction) of the some of the one or more electrically conductive elements 114C and 114D as shown in FIGS. 1 and 2.

FIGS. 3A-3H shows an exemplary method 200 of build-up for the first microelectronic component 104 previously described in reference to FIGS. 1 and 2. As with FIGS. 1 and 2, in FIGS. 3A-3H the first microelectronic component 104 is shown in a highly schematic manner.

In steps shown in FIGS. 3A-3D of the method 200, the first portion 108A of the substrate can be formed. More particularly, the one or more electrically conductive elements 114A, 114B, 114C and 114D can be formed by being patterned on seed layers 202 and 204 as shown in step of FIG. 3A. Such patterning can be done by semi-additive patterning process (SAP), for example. This SAP can include lithography patterning of photoresist film on a substrate or a carrier, followed by plating of the one or more electrically conductive elements 114A, 114B, 114C and 114D and then stripping (e.g., etching) of the photoresist film to achieve the desired pattern for the one or more electrically conductive elements 114A, 114B, 114C and 114D.

The seed layer 202 can comprise a copper (Cu) foil or piece or sputtered Cu. Seed layer 204 can comprise sputtered titanium (Ti) to which the seed layer 202 is attached. The seed layers 202 and 204 can be provided as part of a carrier 206 or can be attached to the carrier 206 in another step of the method 200 that is not specifically illustrated. The carrier 206 can be a releasable panel, a peelable core substrate, or another type of build-up carrier known in the art, for example.

Figure 3A:
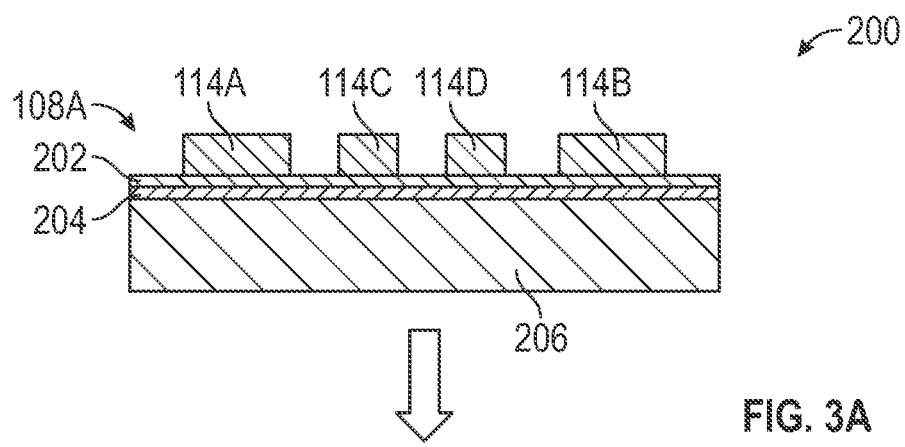
Figure 3B:
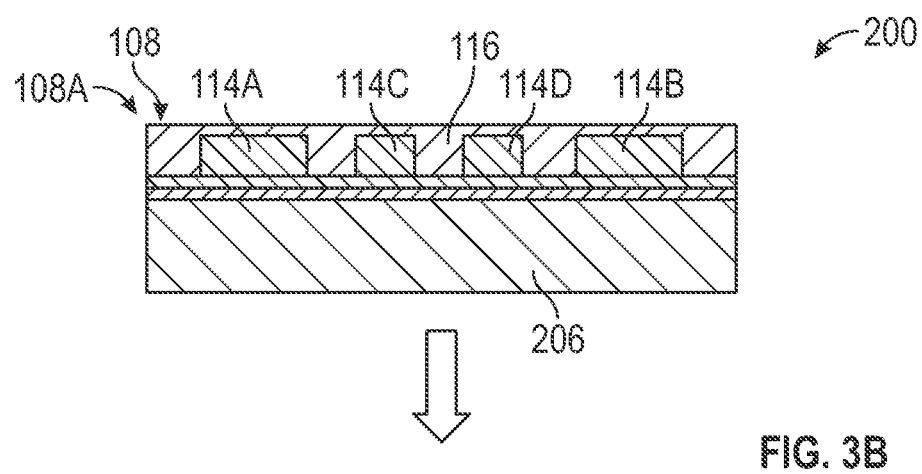
Figure 3C:
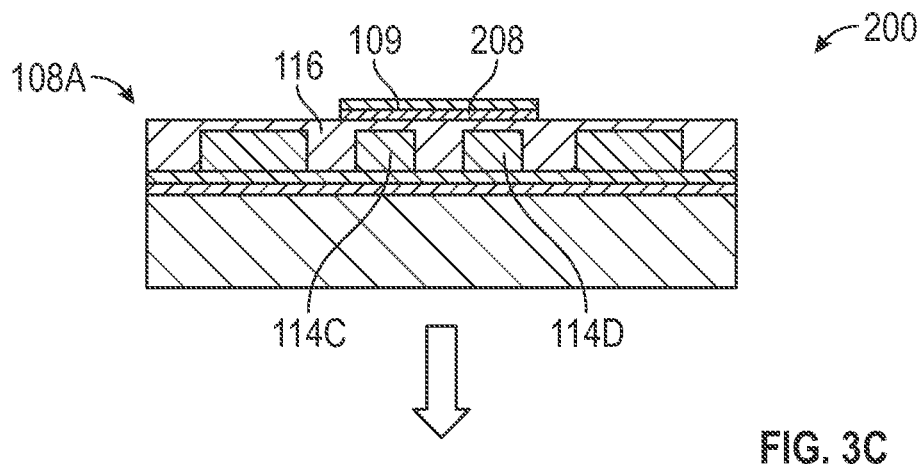

The method 200 in the step of FIG. 3B can proceed to substrate 108 build-up with lamination of the dielectric material 116 (e.g., ABF or another type of material). As shown in the step of FIG. 3B, only a part of the first portion 108A is fabricated, with sufficient thickness to electrically insulate the one or more electrically conductive elements 114A, 114B, 114C and 114D from later added components such as the first magnetic foil 109 (FIGS. 1 and 2). In the step of FIG. 3C, a non-magnetic, electrically insulating adhesive film 208 can be formed on the surface of the dielectric material 116 adjacent the one or more electrically conductive elements 114C and 114D. This can be done by printing an epoxy based paste with either stencil printing, jet printing or another precision printing method, for example. As additionally shown in the step of FIG. 3C, the first magnetic foil 109 can be placed on the non-magnetic, electrically insulating adhesive film 208 using a pick and place process. The one or more electrically conductive elements 114C and 114D underlying the non-magnetic, electrically insulating adhesive film 208 and the first magnetic foil 109 can act as alignment markers for printing and pick and place accuracy.

As shown in the step of FIG. 3D, further dielectric material 116 of the substrate 108 can be laminated or otherwise added over the already existing dielectric material of steps of FIGS. 3B and 3C, as well as over the first magnetic foil 109. This further dielectric material 116 can embed the first magnetic foil 109 within the substrate 108. At the step of FIG. 3D, the first microelectronic device 104 can be subject to a thermal curing process to cure the substrate 108 and the non-magnetic, electrically insulating adhesive film 208.

The step of FIG. 3E can continue the substrate build up process by creating apertures in the first portion 108A and plating electrically conductive material that forms part of the electrically conductive pillars 122 therein. Further SAP process can be used to build a second portion 108B (for example, a re-distribution layer (RDL)) of the substrate 108 atop the first portion 108A in step of FIG. 3F. The build-up process can be repeated in forming further of the one or more electrically conductive elements 114 and the dielectric 116 for the second portion 108B of the substrate. Such build-up can be repeated as desired in forming the substrate 108 in various layers.

Figure 3G:
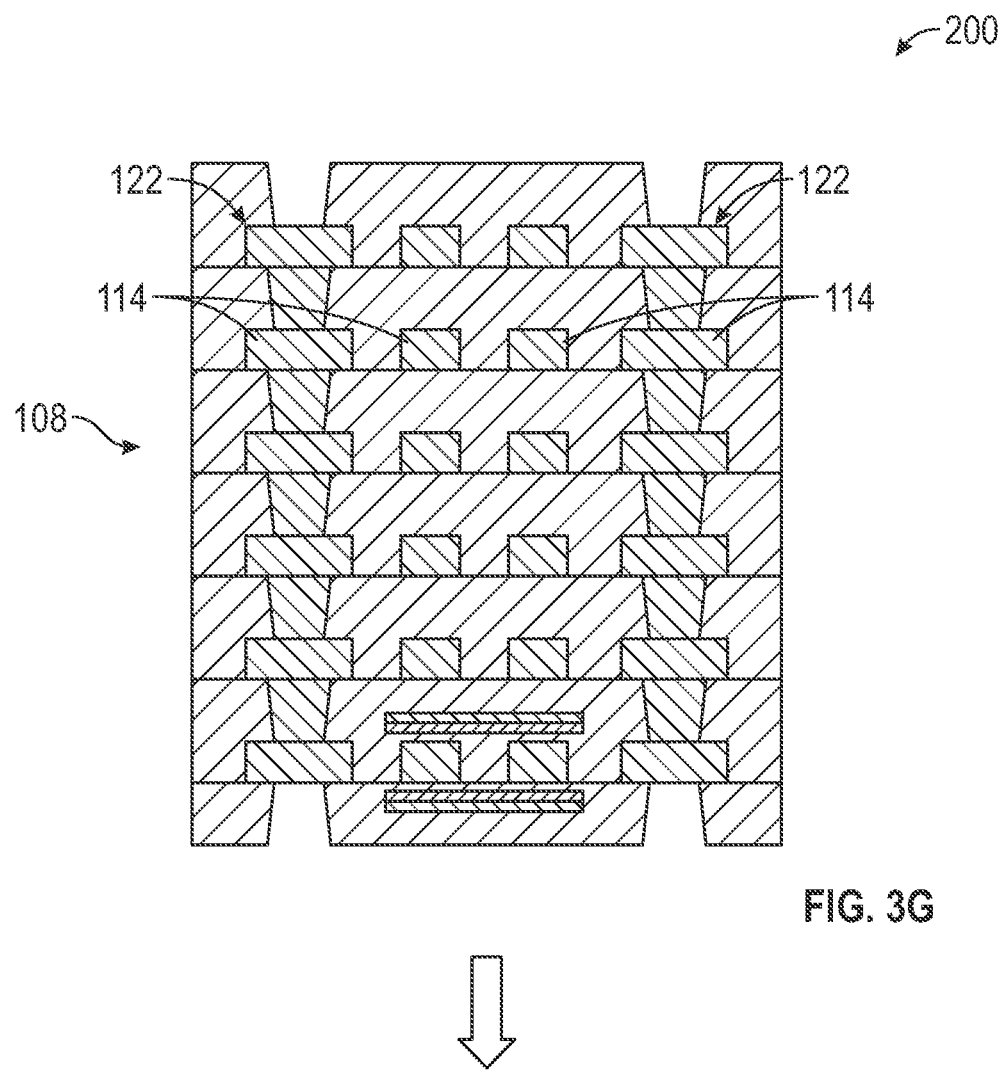
Figure 3H:
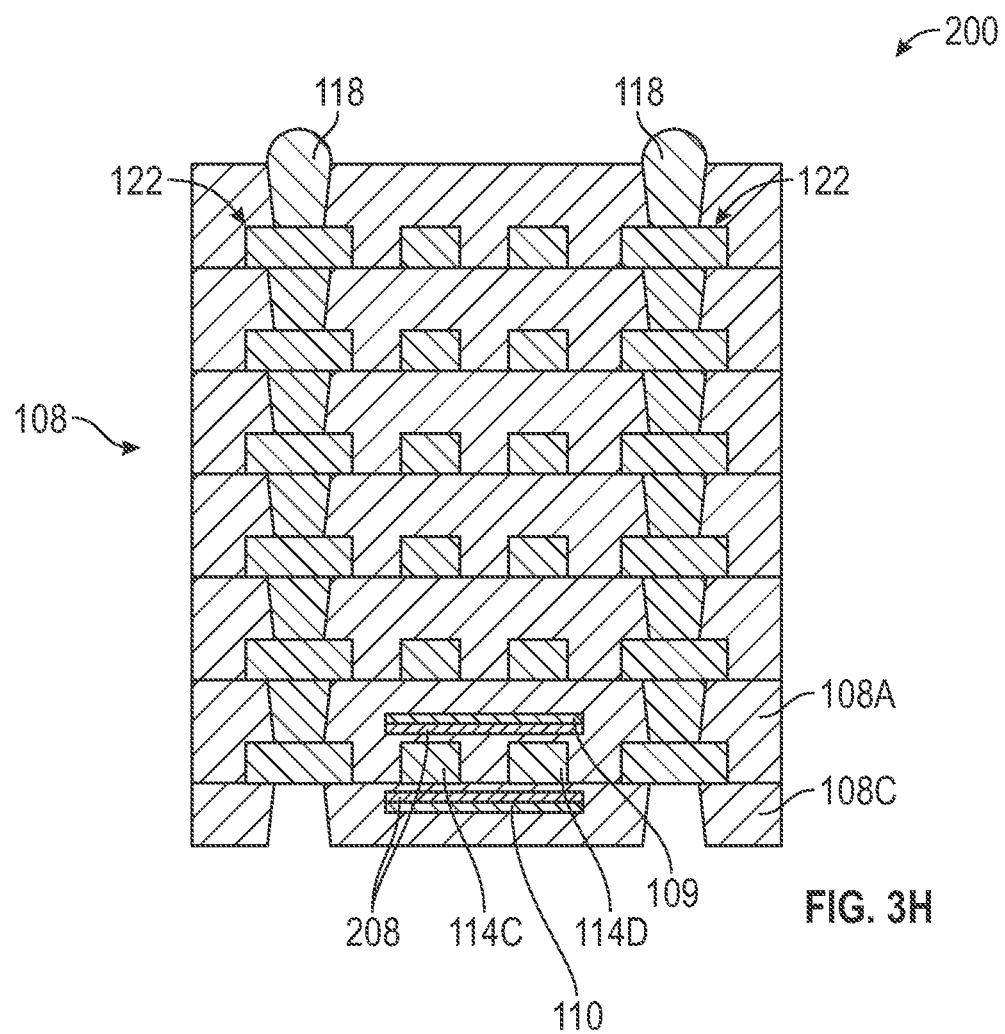

In step of FIG. 3G, the carrier 206 (FIG. 3A) can be separated from the substrate 108 and removed. The one or more electrically conductive elements 114, in particular, the electrically conductive pillars 122 can have a surface etch to better facilitate physical and electrical coupling with the one or more electrical connections 118 (only some shown in FIG. 3H). Steps of FIGS. 3G and 3H show the SAP process continuing to form the outermost portions of the substrate 108 (these portions will have the first and second surfaces 120 and 124 of FIG. 1). For example, step of FIG. 3G shows the second magnetic foil 110 being positioned and embedded in a third portion 108C adjacent the first portion 108A. Such embedding can include the processes previously described with regard to the first magnetic foil 109 including the use of the non-magnetic, electrically insulating adhesive film 208. The second magnetic foil 110 can be positioned adjacent but can be electrically insulated from the one or more electrically conductive elements 114C and 114D. The second magnetic foil 110 can be disposed on an opposing side of the one or more electrically conductive elements 114C and 114D from the first magnetic foil 109. The step of FIG. 3H shows the SAP process being completed and one or more electrical connections 118 beginning to be physically and electrically connected to the electrically conductive pillars 122 at least along one major surface thereof.

Figure 4:
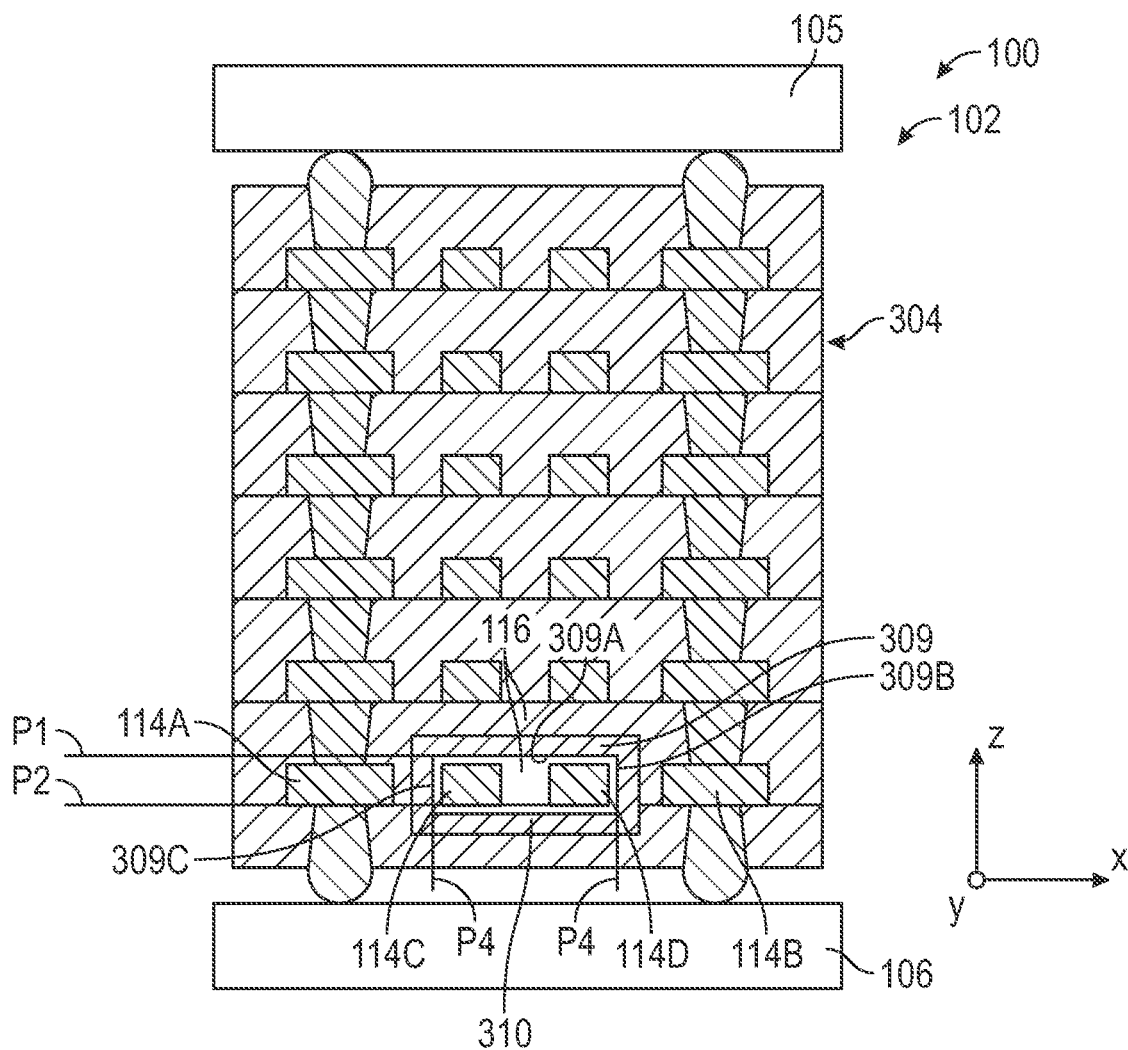
FIG. 4 depicts a cross-section of a schematic representation of another electronic system having an another electronic package with a second embedded magnetic core inductor as a full loop structure formed of magnetic foils according to another example of the present application.

FIG. 4 shows an alternative embodiment of a first microelectronic device 304 having a construction similar to that of the first microelectronic device 104 of FIG. 1. The microelectronic device 304 can be part of the electronic system 100 that can comprise the integrated circuit (IC) package assembly 102, as previously described. In some embodiments, the electronic system 100 and the IC package assembly 102 can include the first microelectronic device 304, the second microelectronic device 105 and the third microelectronic device 106.

The first microelectronic device 304 differs from the first microelectronic device 104 of FIG. 1 in that the first microelectronic device 304 can have a first magnetic foil 309 that is shaped in three dimensions (x-dimension, y-dimension and z-dimensions of the Cartesian coordinate system) and is positioned to enclose at least some of the one or more of electrically conductive elements 114A, 114B, 114C and 114D (e.g., here electrically conductive elements 114C and 114D) in at least two dimensions.

According to one embodiment, the first magnetic foil 309 is positioned within the substrate 108 to have major surfaces 309A and 309B that extend in both the first plane P1 that is substantially parallel with the second plane P2 defined by the at least one layer having the one or more of electrically conductive elements 114A, 114B, 114C and 114D and a third plane P4 that is substantially perpendicular with the second plane P2. More specifically, the major surface 309A can have the first plane P1 that is substantially parallel with the second plane P2 defined by the at least one layer having the one or more of electrically conductive elements 114A, 114B, 114C and 114D. The major surface 309B can have the third plane P4 that is substantially perpendicular with the second plane P2. The first magnetic foil 309 can be symmetrically shaped such that the major surface 309B can be laterally mirrored (in the x-dimension) by a third major surface 309C. The third major surface 309C can have the third plane P4 that is substantially perpendicular with the second plane P2.

Additionally, the first microelectronic device 304 can differ from the first microelectronic device 104 of FIG. 1 in that the first microelectronic device 304 can have a second magnetic foil 310 that is shaped in three dimensions (x-dimension, y-dimension and z-dimensions of the Cartesian coordinate system) and is positioned to enclose at least some of the one or more of electrically conductive elements 114A, 114B, 114C and 114D (e.g., here electrically conductive elements 114C and 114D) in at least two dimensions. Indeed, the second magnetic foil 310 can be shaped and positioned to abut the first magnetic foil 309 so that together the second magnetic foil 310 and the first magnetic foil 309 fully enclose the one or more of electrically conductive elements 114C and 114D in all three dimensions.

Similar to the embodiment of FIGS. 1 and 2, the second magnetic foil 310 is positioned on a second side of the one or more of electrically conductive elements 114A, 114B, 114C and 114D such that the first magnetic foil 309 interfaces with and is spaced from a first side of the one or more of electrically conductive elements 114A, 114B, 114C and 114D and the second magnetic foil 310 interfaces with and is spaced from the second side of the one or more of electrically conductive elements 114A, 114B, 114C and 114D.

The substrate 108 of the first microelectronic device 304 can have thickness of the dielectric material 116 between the first magnetic foil 309 and the some of the one or more of electrically conductive elements 114C and 114D and between the second magnetic foil 310 and the some of the one or more of electrically conductive elements 314C and 314D. This thickness can be between about 1 μm to about 100 μm, inclusive. The dielectric material 116 can include air in the volume defined within the first magnetic foil 309 and the second magnetic foil 310 and around the one or more of electrically conductive elements 114C and 114D according to the embodiment of FIG. 4. According to one embodiment, the dielectric material can have a thickness of between about 3 μm and about 10 μm, inclusive.

FIGS. 5A-5G shows an exemplary method 400 of build-up for the first microelectronic component 304 described in reference to FIG. 4. FIGS. 5A-5G illustrate the similar steps as those of FIGS. 3A-3H but differ in that the first magnetic foil 309 and the second magnetic foil 310 are fabricated to extend in three dimensions rather than the two dimensions of the first magnetic foil 109 and the second magnetic foil 110.

Figure 5A:
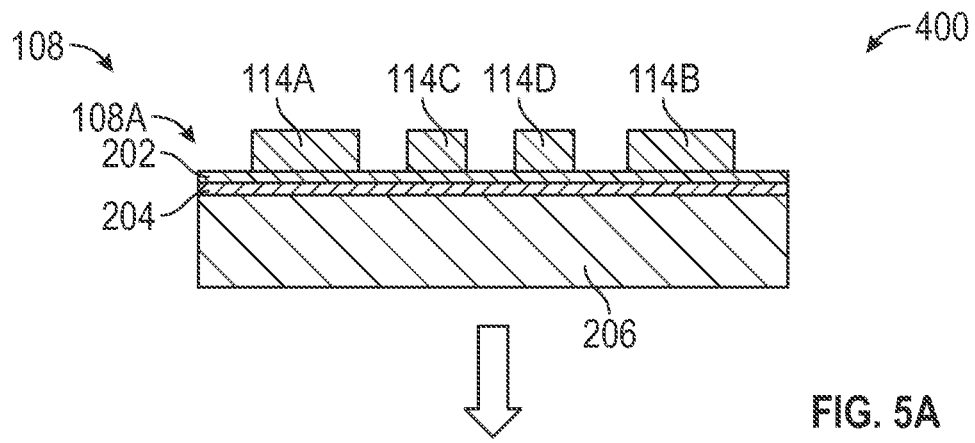
FIGS. 5A-5G depict in cross-sectional schematic representations various stages in an example process for forming the electronic package of FIG. 4 with the embedded magnetic core inductor.

Thus, in the steps shown in FIGS. 5A-5D of the method 400, the first portion 108A of the substrate 108 can be formed. More particularly, the one or more electrically conductive elements 114A, 114B, 114C and 114D can be formed by being patterned on seed layers using SAP, for example as shown in FIG. 5A. The SAP can include lithography patterning of photoresist film on a substrate or a carrier, followed by plating of the one or more electrically conductive elements 114A, 114B, 114C and 114D and then stripping of the photoresist film to achieve the desired pattern for the one or more electrically conductive elements 114A, 114B, 114C and 114D.

The seed layer 202, 204 and carrier 206 shown in FIG. 5A can be constructed as previously described in reference to the method 200 of FIGS. 3A-3H.

Figure 5B:
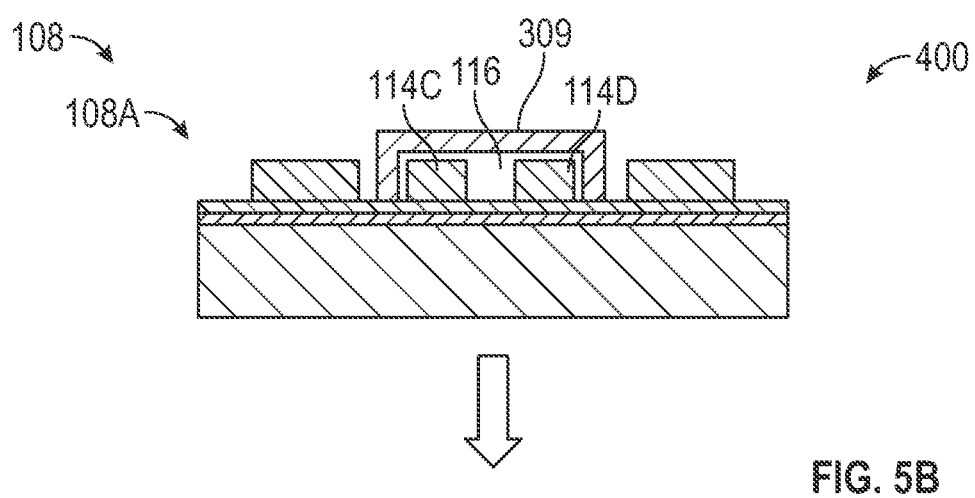

The method 400 in the step of FIG. 5B can proceed to positioning and fabrication of the first magnetic foil 309 adjacent the one or more electrically conductive elements 114C and 114D. A thin layer of dielectric material 116 such as air can be positioned between the first magnetic foil 309 and the one or more electrically conductive elements 114C and 114D. The one or more electrically conductive elements 114C and 114D underlying the first magnetic foil 309 can act as alignment markers for printing and pick and place accuracy.

Figure 5C:
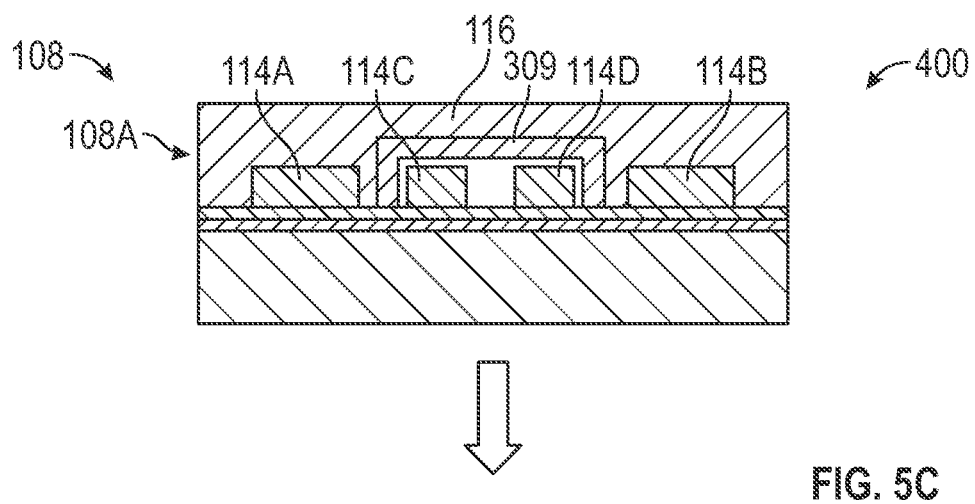

FIG. 5C shows substrate 108 build-up with lamination of the dielectric material 116 (e.g., ABF or another type of material) to embed the first magnetic foil 309 within the substrate 108. As shown in step of FIGS. 5C and 5D, the first portion 108A is fabricated, with dielectric material 116 having sufficient thickness to electrically insulate the one or more electrically conductive elements 114A, 114B, 114C and 114D from components other electrically conductive elements. As discussed in reference to FIG. 4, in some cases air can be utilized to insulate the first magnetic foil 309 from the one or more electrically conductive elements 114C and 114D.

Figure 5D:
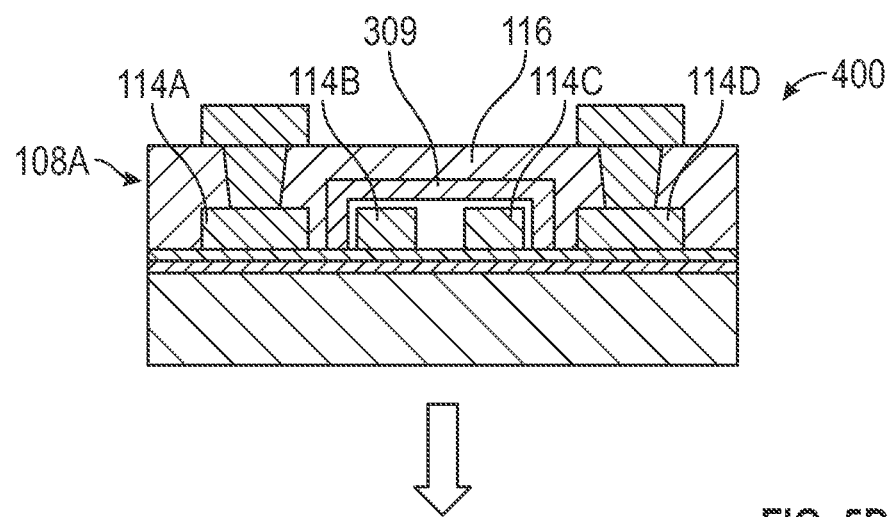
Figure 5E:
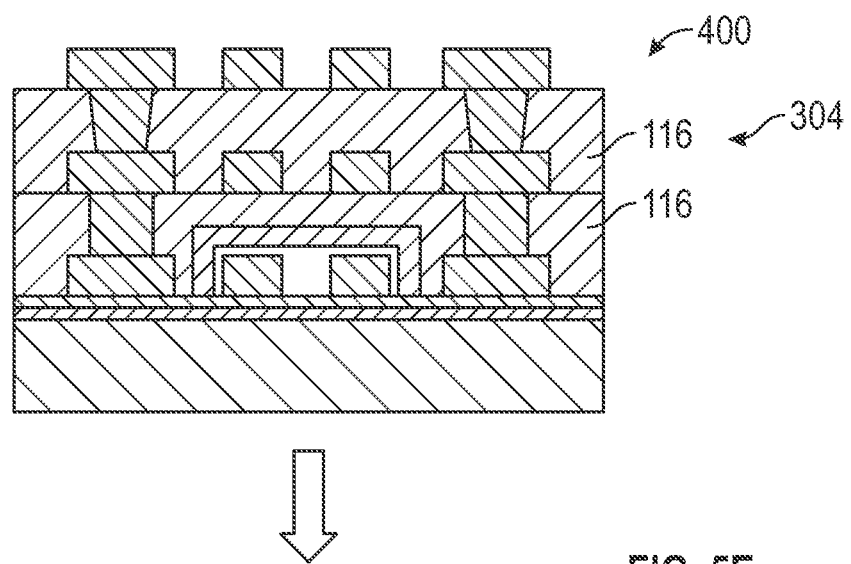
Figure 5F:
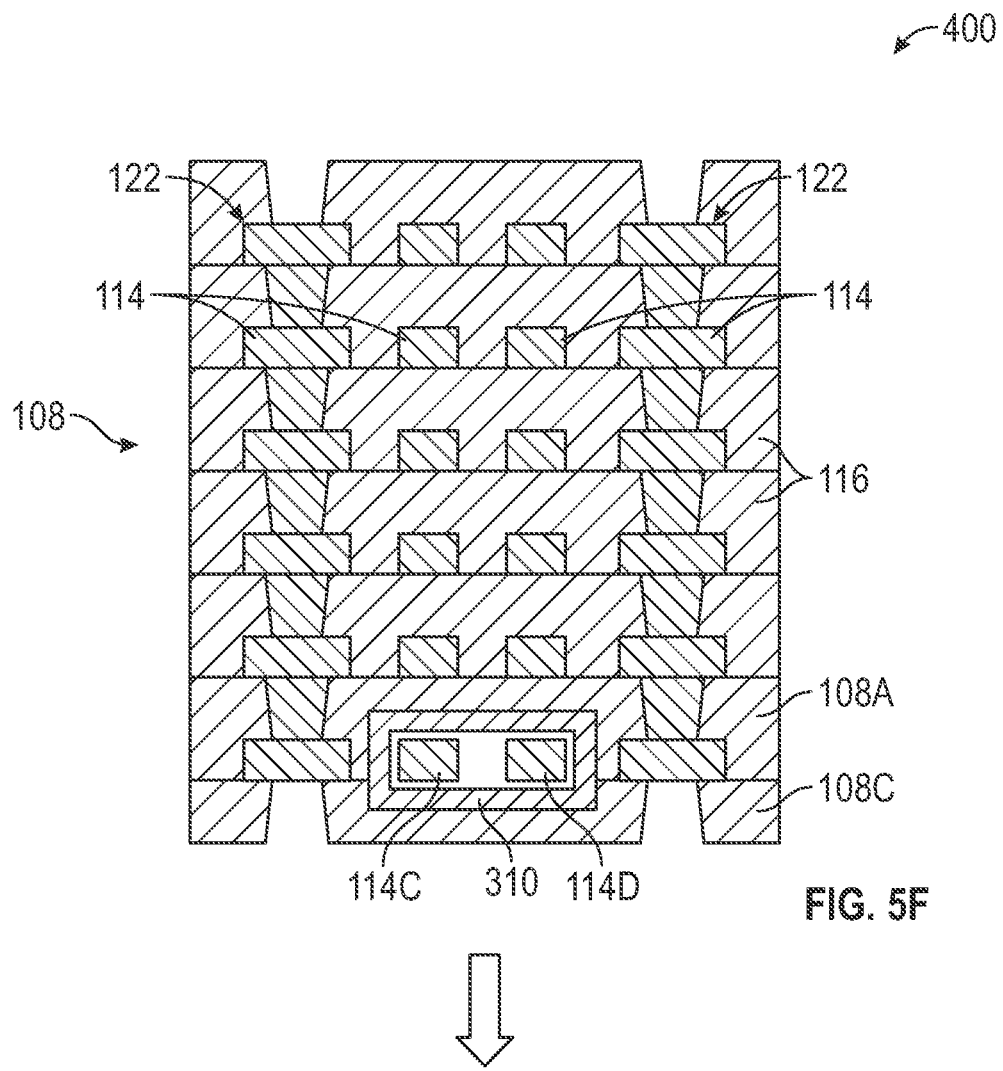

As shown in step of FIG. 5F, further dielectric material 116 of a second portion of the substrate 108, can be laminated or otherwise added over the already existing dielectric material 116 of steps of FIGS. 5C and 5D. The first microelectronic device 304 can be subject to a thermal curing process to cure the substrate 108. Further SAP process can be used to build the substrate 108 as shown in the step of FIG. 5F. The build-up process can be repeated in forming a desired of the one or more electrically conductive elements 114 and the dielectric 116 of the substrate 108.

Figure 5G:
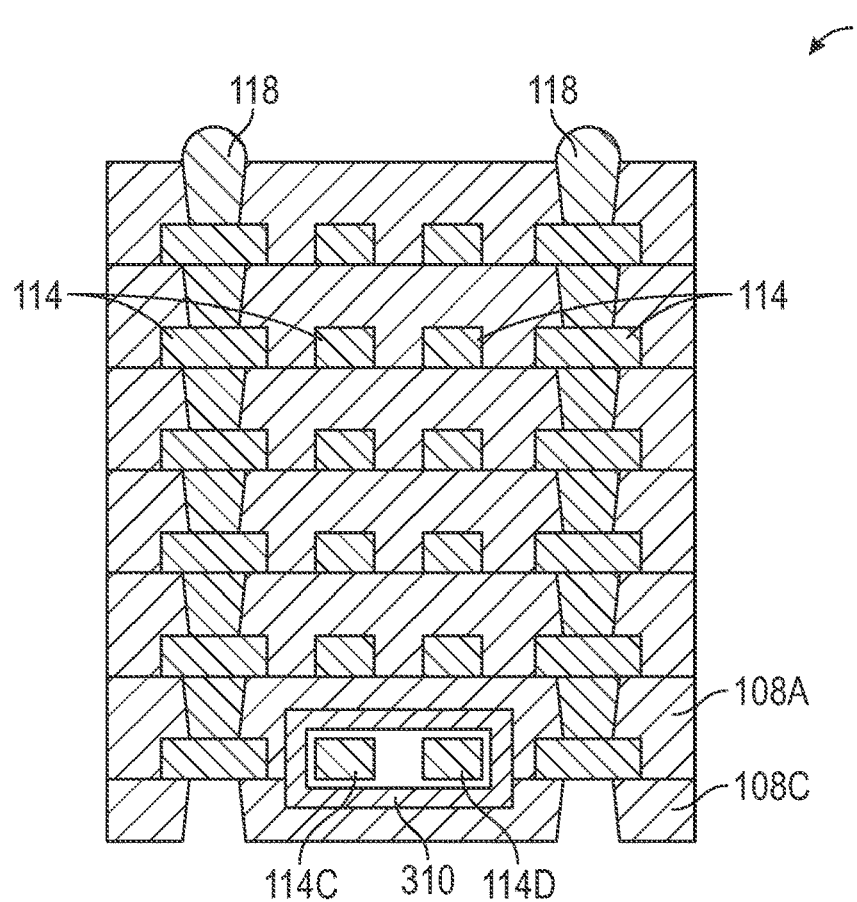

In the step of FIG. 5F, the carrier 206 (FIG. 5A) can be separated from the substrate 108 and removed. The one or more electrically conductive elements 114, in particular, the electrically conductive pillars 122 can have a surface etch to better facilitate physical and electrical coupling with the one or more electrical connections 118 (only some shown in FIG. 5G). Steps of FIGS. 5F and 5G show the SAP process continuing to form the second magnetic foil 310 being positioned in a third portion 108C of the substrate 108 adjacent the first portion 108A. The second magnetic foil 310 can be positioned adjacent but can be electrically insulated from the one or more electrically conductive elements 114C and 114D. The second magnetic foil 310 can be disposed on an opposing side of the one or more electrically conductive elements 114C and 114D from the first magnetic foil 309 so as to enclose the one or more electrically conductive elements 114C and 114D in three dimensions. The step of FIG. 5F shows the SAP process being completed and one or more electrical connections 118 beginning to be physically and electrically connected to the electrically conductive pillars 122 at least along one major surface thereof.

Figure 6:
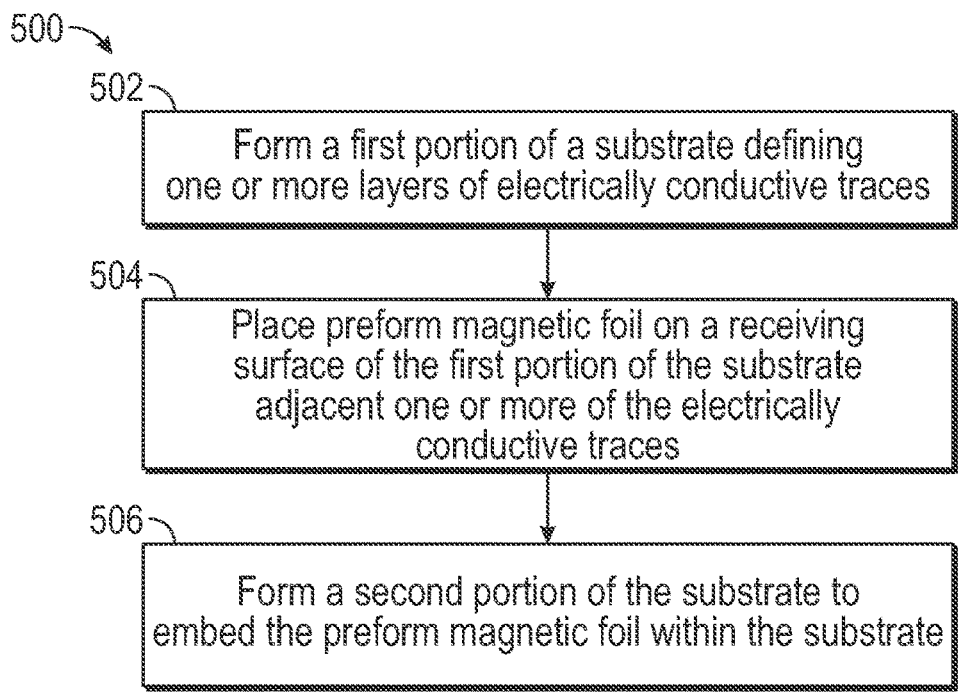
FIG. 6 is a flow diagram of an exemplary method of fabricating a microelectronic device having the magnetic core inductor embedded within the substrate using magnetic foils as a core.

FIG. 6 shows a flow diagram of a method 500 of fabricating a microelectronic device having an embedded magnetic core inductor with magnetic foils as the external magnetic core material. The method 500 can form 502 a first portion of substrate. The first portion of the substrate can define one or more layers of electrically conductive elements separated by respective one or more layers of dielectric material. The method 500 can place 504 a magnetic foil on a receiving surface of the first portion of the substrate adjacent one or more of the electrically conductive elements. The magnetic foil can be positioned to interface with and be spaced from the one or more of electrically conductive elements. The method can 506 form a second portion of the substrate to embed the magnetic foil within the substrate. According to the placing of the method 500, the magnetic foil can be positioned along the receiving surface to have a major surface thereof extend in a first plane that is substantially parallel with a second plane defined by one of the one or more layers of electrically conductive elements. In other embodiments, the method 500 of placing the magnetic foil includes positioning the preform magnetic along the receiving surface to have major surfaces thereof extend in both a first plane that is substantially parallel with a second plane defined by one of the one or more layers of electrically conductive elements and a third plane that is substantially perpendicular with the second plane. The method 500 can further include placing a second magnetic foil on a second side of the one or more electrically conductive elements and wherein the second magnetic foil interfaces with and is spaced from the second side of the one or more of electrically conductive elements. The placing the magnetic foil and placing the second magnetic foil includes placing the magnetic foil and the second magnetic foil to extend in three dimensions so that the magnetic foil and the second magnetic foil together enclose the one or more of electrically conductive elements in three dimensions. The method 500 can further have placing a non-magnetic adhesive material between the magnetic foil and the one or more of electrically conductive elements and/or forming at least two electrical contacts disposed laterally to either side of the magnetic foil and the one or more of electrically conductive elements.

Figure 7:
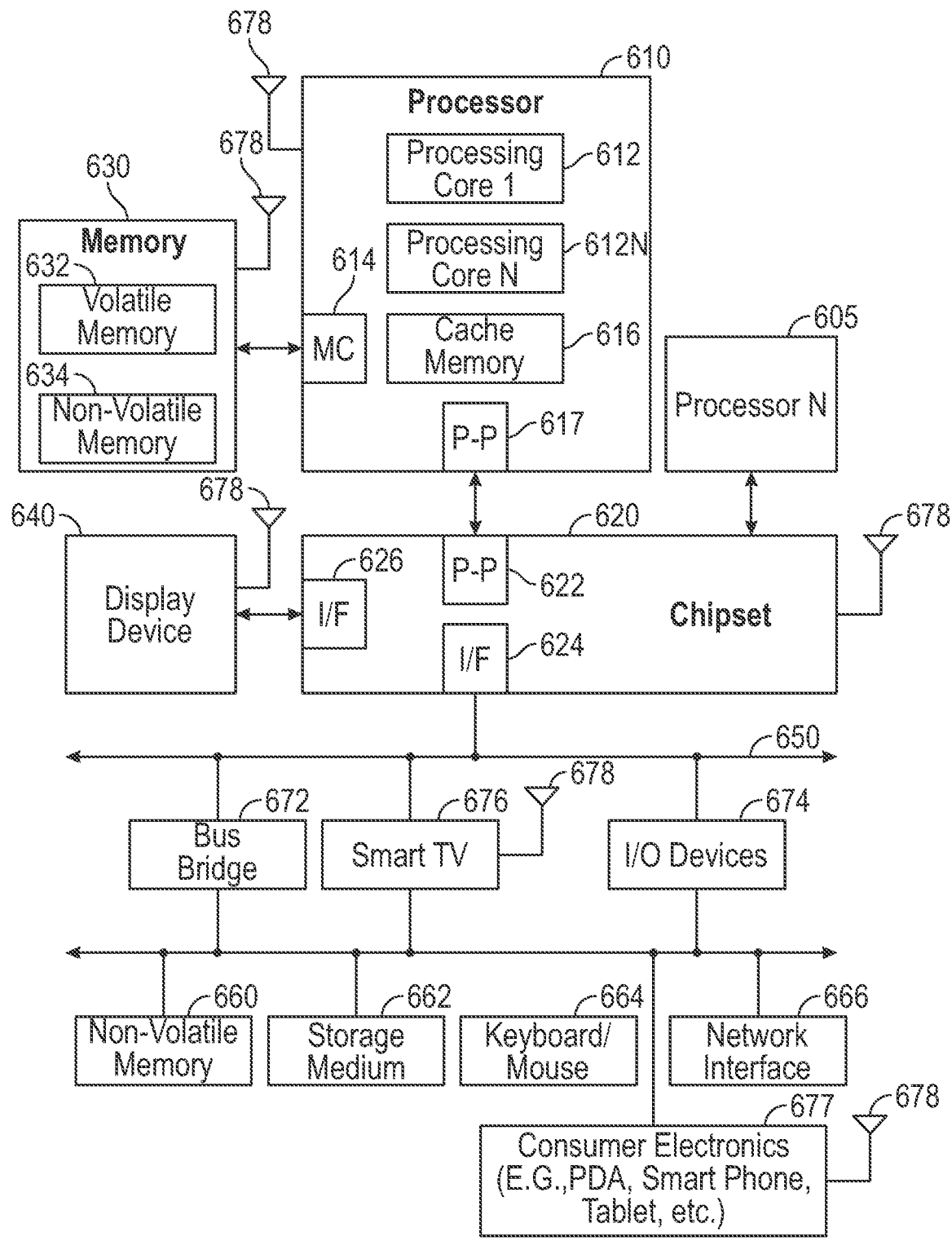
FIG. 7 depicts a system level diagram which may incorporate an electronics package including an embedded magnetic core inductor such as any of the electronics packages configured or formed as described herein.

FIG. 7 illustrates a system level diagram, according to an embodiment of the invention. For instance, FIG. 7 depicts an example of an electronic device (e.g., system) including the first microelectronic device 104 and/or the first microelectronic device 304 perhaps as part of the IC package assembly 102; FIG. 7 is included to show an example of a higher level device application for the present inventive subject matter. In an embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In an embodiment, processor 610 has one or more processing cores 612 and 612N, where 612N represents the Nth processor core inside processor 610 where N is a positive integer. In an embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions, and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In an embodiment, the wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In an embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display device 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In an embodiment, chipset 620 couples with a non-volatile memory 660, a mass storage device(s) 662, a keyboard/mouse 664, and a network interface 666 via interface 624 and/or 626, smart TV 676, consumer electronic 677, etc.

In an embodiment, mass storage device 662 includes, but is not limited to, a solid state drive, a hard disk drive, a universal serial bus flash memory drive, or any other form of computer data storage medium. In an embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of cache memory 616) may be incorporated into processing core 612.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present disclosure. Thus, it should be understood that although the present disclosure has been specifically disclosed by specific embodiments and optional features, modification and variation of the concepts herein disclosed may be resorted to by those of ordinary skill in the art, and that such modifications and variations are considered to be within the scope of embodiments of the present disclosure.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the disclosure, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about" as used herein may allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Additional Embodiments

The following examples are provided, the numbering of which is not to be construed as designating levels of importance:

In Example 1, an electronic package for use as an integrated voltage regulator with a microelectronic system, the electronic package can comprise: a substrate defining at least one layer having one or more of electrically conductive elements separated by a dielectric material; and a magnetic foil having ferromagnetic alloy ribbons, the magnetic foil embedded within the substrate adjacent to the one or more of electrically conductive elements, wherein the magnetic foil is positioned to interface with and be spaced from the one or more of electrically conductive elements.

In Example 2, the electronic package of Example 1 can include the magnetic foil is positioned within the substrate to have a major surface thereof extend in a first plane that is substantially parallel with a second plane defined by the at least one layer having the one or more of electrically conductive elements.

In Example 3, the electronic package of any one or any combination of Examples 1-2, wherein the magnetic foil can be positioned within the substrate to have major surfaces thereof extend in both a first plane that is substantially parallel with a second plane defined by the at least one layer having the one or more of electrically conductive elements and a third plane that is substantially perpendicular with the second plane.

In Example 4, the electronic package of any one or any combination of Examples 1-3, wherein the magnetic foil can be shaped and positioned in two dimensions to enclose the one or more of electrically conductive elements in one or more dimensions, and wherein the magnetic foil is operable with the one or more of the electrically conductive elements to act as an inductor.

In Example 5, the electronic package of any one or any combination of Examples 1-4, wherein the magnetic foil can be shaped in three dimensions to enclose the one or more of electrically conductive elements in the at least two dimensions.

In Example 6, the electronic package of any one or any combination of Examples 1-5, can further comprise a second magnetic foil that can be positioned on a second side of the one or more of electrically conductive elements such that the magnetic foil interfaces with and is spaced from a first side of the one or more of electrically conductive elements and the second magnetic foil interfaces with and is spaced from the second side of the one or more of electrically conductive elements.

In Example 7, the electronic package of Example 6, wherein both the first magnetic foil and the second magnetic foil can extend in three dimensions and enclose the one or more of electrically conductive elements in three dimensions.

In Example 8, the electronic package of any one or any combination of Examples 1-7, can further comprise a non-magnetic adhesive material positioned between the magnetic foil and the one or more of electrically conductive elements.

In Example 9, the electronic package of any one or any combination of Examples 1-8, wherein the dielectric material of the substrate can separate the magnetic foil and the one or more of electrically conductive elements.

In Example 10, the electronic package of any one or any combination of Examples 1-9, can further comprise at least two electrically conductive elements disposed laterally to either side of the magnetic foil and the one or more of electrically conductive elements.

In Example 11, an electronic system that can comprise: a board; a semiconductor die, and an integrated voltage regulator configured to couple to the semiconductor die, the integrated voltage regulator comprising: a substrate defining multiple layers of conductive traces separated by respective layers of dielectric material; a plurality of magnetic foils each having ferromagnetic alloy ribbons embedded within the substrate adjacent one or more of the multiple layers, wherein at least one of the plurality of magnetic foils is positioned to interface with and be spaced from a first side of one or more of electrically conductive elements, and wherein at least another of the plurality of magnetic foils is positioned to interface with and be spaced from a second side of the one or more of electrically conductive elements; multiple electrical contacts extending through the substrate, wherein the multiple contacts include at least two electrical contacts disposed laterally to either side of the magnetic foil and the one or more of electrically conductive elements.

In Example 12, the electronic system of Example 11, wherein the plurality magnetic foils can be shaped in three dimensions to enclose the one or more of electrically conductive elements in three dimensions.

In Example 13, the electronic system of any one or any combination of Examples 11-12, wherein the at least one of the plurality of magnetic foils can be positioned within the substrate to have first major surfaces thereof extend in both a first plane that is substantially parallel with a second plane defined by one of the multiple layers of conductive traces and a third plane that is substantially perpendicular with the second plane, and wherein the at least another the plurality of magnetic foils is positioned within the substrate to have second major surfaces extend in both the first plane and the third plane.

In Example 14, a method of forming an electronic package, the method can comprise: forming a first portion of substrate, the first portion of the substrate defining one or more layers of electrically conductive elements separated by respective one or more layers of dielectric material; placing a magnetic foil on a receiving surface of the first portion of the substrate adjacent one or more of the electrically conductive elements, wherein the magnetic foil is positioned to interface with and be spaced from the one or more of electrically conductive elements, and wherein the magnetic foil is operable with the one or more of the electrically conductive elements to act as an inductor; and forming a second portion of the substrate to embed the magnetic foil within the substrate.

In Example 15, the method of Example 14, wherein placing the magnetic foil includes positioning the magnetic foil along the receiving surface to have a major surface thereof extend in a first plane that is substantially parallel with a second plane defined by one of the one or more layers of electrically conductive elements.

In Example 16, the method of any one or any combination of Examples 14-15, wherein placing the magnetic foil can include positioning the preform magnetic along the receiving surface to have major surfaces thereof extend in both a first plane that is substantially parallel with a second plane defined by one of the one or more layers of electrically conductive elements and a third plane that is substantially perpendicular with the second plane.

In Example 17, the method of any one or any combination of Examples 14-16, can further comprise placing a second magnetic foil on a second side of the one or more electrically conductive elements and wherein the second magnetic foil interfaces with and is spaced from the second side of the one or more of electrically conductive elements.

In Example 18, the method of Example 17, wherein placing the magnetic foil and placing the second magnetic foil can include placing the magnetic foil and the second magnetic foil to extend in three dimensions so that the magnetic foil and the second magnetic foil together enclose the one or more of electrically conductive elements in three dimensions.

In Example 19, the method of any one or any combination of Examples 14-18, can further comprise placing a non-magnetic adhesive material between the magnetic foil and the one or more of electrically conductive elements.

In Example 20, the method of any one or any combination of Examples 14-19, can further comprise forming at least two electrically conductive elements disposed laterally to either side of the magnetic foil and the one or more of electrically conductive elements.

The invention claimed is:

1. An electronic package for use as an integrated voltage regulator with a microelectronic system, the electronic package comprising:
    a substrate defining at least one layer having one or more of electrically conductive elements separated by a dielectric material;
    a magnetic foil having ferromagnetic alloy ribbons, the magnetic foil embedded within the substrate adjacent to the one or more of electrically conductive elements, wherein the magnetic foil is positioned to interface with and be spaced from the one or more of electrically conductive elements;
    a second magnetic foil that is positioned on a second side of the one or more of electrically conductive elements such that the magnetic foil interfaces with and is spaced from a first side of the one or more of electrically conductive elements and the second magnetic foil interfaces with and is spaced from the second side of the one or more of electrically conductive elements;
    wherein both the magnetic foil and the second magnetic foil extend in three dimensions and abut one another to fully enclose the one or more of electrically conductive elements in three dimensions.

2. The electronic package of claim 1, wherein the magnetic foil is positioned within the substrate to have a major surface thereof extend in a first plane that is substantially parallel with a second plane defined by the at least one layer having the one or more of electrically conductive elements.

3. The electronic package of claim 1, wherein the magnetic foil is positioned within the substrate to have major surfaces thereof extend in both a first plane that is substantially parallel with a second plane defined by the at least one layer having the one or more of electrically conductive elements and a third plane that is substantially perpendicular with the second plane.

4. The electronic package of claim 1, wherein the magnetic foil is shaped and positioned in two dimensions to enclose the one or more of electrically conductive elements in one or more dimensions, and wherein the magnetic foil is operable with the one or more of the electrically conductive elements to act as an inductor.

5. The electronic package of claim 1, wherein the magnetic foil is shaped in three dimensions to enclose the one or more of electrically conductive elements in the at least two dimensions, and wherein the magnetic foil is operable with the one or more of the electrically conductive elements to act as an inductor.

6. The electronic package of claim 1, further comprising a non-magnetic adhesive material positioned between the magnetic foil and the one or more of electrically conductive elements.

7. The electronic package of claim 1, wherein the dielectric material of the substrate separates the magnetic foil and the one or more of electrically conductive elements.

8. The electronic package of claim 1, further comprising at least two electrically conductive elements disposed laterally to either side of the magnetic foil and the one or more of electrically conductive elements.

9. An electronic system, comprising:
   a board;
   a semiconductor chip; and
   an integrated voltage regulator configured to couple to the semiconductor chip, comprising:
      a substrate defining multiple layers of one or more of electrically conductive elements separated by respective layers of dielectric material;
      a plurality of magnetic foils each having ferromagnetic alloy ribbons embedded within the substrate adjacent one or more of the multiple layers, wherein at least one of the plurality of magnetic foils is positioned to interface with and be spaced from a first side of the one or more of electrically conductive elements, and wherein at least another of the plurality of magnetic foils is positioned to interface with and be spaced from a second side of the one or more of electrically conductive elements;
      multiple electrical contacts extending through the substrate, wherein the multiple contacts include at least two electrical contacts disposed laterally to either side of the plurality of magnetic foils and the one or more of electrically conductive elements;
      wherein the plurality magnetic foils are shaped in three dimensions to abut and fully enclose the one or more of electrically conductive elements in three dimensions.

10. The electronic system of claim 9, wherein the at least one of the plurality of magnetic foils is positioned within the substrate to have first major surfaces thereof extend in both a first plane that is substantially parallel with a second plane defined by one of the multiple layers of the one or more of electrically conductive elements and a third plane that is substantially perpendicular with the second plane, and wherein the at least another the plurality of magnetic foils is positioned within the substrate to have second major surfaces extend in both the first plane and the third plane.

11. An electronic package for use as an integrated voltage regulator with a microelectronic system, the electronic package comprising:
    a substrate defining at least one layer having one or more of electrically conductive elements separated by a dielectric material; and
    a magnetic foil having ferromagnetic alloy ribbons, the magnetic foil embedded within the substrate adjacent to the one or more of electrically conductive elements, wherein the magnetic foil is positioned within the substrate to have major surfaces thereof extend in both a first plane that is substantially parallel with a second plane defined by the at least one layer having the one or more of electrically conductive elements and a third plane that is substantially perpendicular with the second plane; and
    a second magnetic foil that is positioned on a second side of the one or more of electrically conductive elements such that the magnetic foil interfaces with and is spaced from a first side of the one or more of electrically conductive elements and the second magnetic foil interfaces with and is spaced from the second side of the one or more of electrically conductive elements;
    wherein both the magnetic foil and the second magnetic foil extend in three dimensions and abut one another to fully enclose the one or more of electrically conductive elements in three dimensions.

12. The electronic package of claim 11, wherein the magnetic foil is shaped in three dimensions to enclose the one or more of electrically conductive elements in the at least two dimensions, and wherein the magnetic foil is operable with the one or more of the electrically conductive elements to act as an inductor.

13. The electronic package of claim 11, further comprising a non- magnetic adhesive material positioned between the magnetic foil and the one or more of electrically conductive elements.

14. The electronic package of claim 11, wherein the dielectric material of the substrate separates the magnetic foil and the one or more of electrically conductive elements.

15. The electronic package of claim 11, further comprising at least two electrically conductive elements disposed laterally to either side of the magnetic foil and the one or more of electrically conductive elements.

* * * * *